(12) United States Patent
Huang et al.

(10) Patent No.: US 11,989,049 B2
(45) Date of Patent: May 21, 2024

(54) OSCILLATOR AND CLOCK CIRCUIT (71) Applicant: HUAWEI TECHNOLOGIES CO., LTD., Guangdong (CN)

(72) Inventors: Jichao Huang, Shenzhen (CN); Qing Min, Shanghai (CN); Lei Lu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 227 days.

(21) Appl. No.: 17/487,214

(22) Filed: Sep. 28, 2021

(65) Prior Publication Data
US 2022/0011810 A1 Jan. 13, 2022

Related U.S. Application Data (63) Continuation of application No. PCT/CN2019/080585, filed on Mar. 29, 2019.

(51) Int. Cl.
*G06F 1/08* (2006.01)
*H03B 5/12* (2006.01)
(Continued)

(52) U.S. Cl.
CPC .............. *G06F 1/08* (2013.01); *H03B 5/1228* (2013.01); *H03L 7/0991* (2013.01); *H03L 7/187* (2013.01)

(58) Field of Classification Search
CPC ........ G06F 1/08; H03B 5/1228; H03L 7/0991
(Continued)

(56) References Cited

U.S. PATENT DOCUMENTS 6,211,745 B1 * 4/2001 Mucke ................ H03F 3/45085
257/595
7,411,468 B2 * 8/2008 Luong .................. H03B 5/1228
331/117 R
(Continued)

FOREIGN PATENT DOCUMENTS

CN 1282460 A 1/2001
CN 101159427 A * 4/2008
(Continued)

OTHER PUBLICATIONS

Extended European Search Report issued in European Application No. 19922675.4 dated Feb. 18, 2022 (9 pages—available in Global Dossier).
(Continued)

*Primary Examiner* — Ryan Jager (57) ABSTRACT

An oscillator and a clock circuit are disclosed. In an oscillator (100), a tail inductor connected to a cross-coupled transistor includes at least two inductors connected in parallel. Therefore, an inductance of the tail inductor is less than an inductance of any one of the inductors. This can address a design difficulty that a tail inductor with a smaller inductance needs to be used as an operating frequency of a VCO increases. The oscillator (100) includes a first cross-coupled transistor (121) and a first tail inductor (111). The first tail inductor (111) includes at least two inductors connected in parallel. The first tail inductor (111) is coupled to a source of the first cross-coupled transistor (121). The source of the first cross-coupled transistor (121) is coupled to a power supply or a ground through the first tail inductor (111).

14 Claims, 10 Drawing Sheets (51) Int. Cl.
*H03L 7/099* (2006.01)
*H03L 7/187* (2006.01)

(58) Field of Classification Search
USPC ........................................................ 327/291
See application file for complete search history.

(56) References Cited

U.S. PATENT DOCUMENTS

| | | | | |
|---|---|---|---|---|
| 7,688,153 | B2 | 3/2010 | Jacobsson et al. | |
| 8,963,648 | B2* | 2/2015 | Shanan | H03B 1/04 |
| | | | | 331/177 V |
| 9,214,895 | B2* | 12/2015 | Shanan | H03B 5/1215 |
| 9,275,784 | B2* | 3/2016 | Hekmat | H01F 27/006 |
| 2008/0266005 | A1* | 10/2008 | Jacobsson | H03B 5/124 |
| | | | | 331/108 A |
| 2013/0082788 | A1* | 4/2013 | Shanan | H03B 5/1243 |
| | | | | 331/108 R |
| 2014/0266479 | A1* | 9/2014 | Rong | H03B 5/1228 |
| | | | | 331/117 FE |
| 2017/0054434 | A1* | 2/2017 | Chakrabarti | H03B 5/1221 |

FOREIGN PATENT DOCUMENTS

| | | | |
|---|---|---|---|
| CN | 101159427 A | | 4/2008 |
| CN | 103166573 A | | 6/2013 |
| CN | 107787551 A | | 3/2018 |
| TW | I392220 B | * | 4/2013 |
| TW | I392220 B | | 4/2013 |

OTHER PUBLICATIONS

International Search Report and Written Opinion issued in PCT/CN2019/080585, dated Dec. 31, 2019, 10 pages.

* cited by examiner

OSCILLATOR AND CLOCK CIRCUIT

CROSS-REFERENCE TO RELATED APPLICATIONS

This application is a continuation of International Application No. PCT/CN2019/080585, filed on Mar. 29, 2019, the disclosure of which is hereby incorporated by reference in its entirety.

TECHNICAL FIELD

Embodiments of this application relate to the field of electronic technologies, and in particular, to an oscillator and a clock circuit.

BACKGROUND

An oscillator is a pulse conversion circuit that converts a level or a control word into a corresponding frequency, in other words, is a circuit in which an output pulse frequency is proportional to an input signal. Oscillators are widely used in automatic control, automatic measurement, detection, and other technical fields. There are two types of oscillators: a voltage controlled oscillator (VCO) and a digitally controlled oscillator (DCO). A difference between the VCO and the DCO is quite small, and the DCO lacks only a variable capacitance diode compared with the VCO. For ease of description, the VCO is used as an example for description below.

The voltage controlled oscillator mainly includes an inductor (L)-capacitor (C) parallel resonant tank (LC tank) and a cross-coupled transistor (which is also referred to as a transistor pair). The LC tank may also be referred to as a resonant circuit. The cross-coupled transistor is an electronic device obtained by packaging two metal-oxide-semiconductor (MOS) field effect transistors with a same performance parameter, and can form a differential amplifier with excellent performance in a simplest way. Due to an inherent disadvantage of the MOS transistors, the cross-coupled transistor generates flicker noise. The flicker noise enters the LC tank and affects noise performance of the oscillator. To suppress the flicker noise of the cross-coupled transistor, an inductor is usually disposed at a source of each MOS transistor in the cross-coupled transistor, and the inductor is usually referred to as a tail inductor (tail inductor). After the tail inductor is connected to a parasitic capacitor B at a source of the cross-coupled transistor of the VCO in parallel, when a resonance frequency between the inductor and the capacitor connected in parallel is twice an operating frequency of the VCO, the group of inductances including the capacitor and the inductor has a high impedance characteristic. After operating frequencies of the capacitor and the VCO are determined, an inductor corresponding to the operating frequencies of the capacitor and the VCO needs to be selected. However, to achieve the high impedance characteristic, a relatively high resonance frequency is required. In this case, an inductance corresponding to the resonance frequency is usually quite small, that is, an inductance of the tail inductor is quite small.

As the operating frequency of the VCO increases, a tail inductor with a smaller inductance needs to be used, and a design of the oscillator is more difficult.

SUMMARY

Embodiments of this application provide an oscillator. In the oscillator, a tail inductor connected to a cross-coupled transistor includes at least two inductors connected in parallel. Therefore, an inductance of the tail inductor is less than an inductance of any one of the inductors. Through technical solutions of this application, when an operating frequency of a VCO increases, an inductor with a relatively large size may be used to implement a tail inductor with a small impedance, thereby avoiding a design difficulty of a tail inductor with a smaller inductance.

According to a first aspect, an embodiment of this application provides an oscillator. The oscillator includes a first tail inductor, a resonant circuit, and a first cross-coupled transistor. The first tail inductor includes at least two inductors connected in parallel. The first tail inductor is coupled to a source of the first cross-coupled transistor. The source of the first cross-coupled transistor is coupled to a power supply or a ground through the first tail inductor. The first cross-coupled transistor includes at least a first transistor and a second transistor. A gate of the first transistor, a drain of the second transistor, and one end of the resonant circuit are coupled to a first node. A drain of the first transistor, a gate of the second transistor, and the other end of the resonant circuit are coupled to a second node.

In this application, the first tail inductor in the oscillator includes the at least two first inductors connected in parallel. The first inductors may be inductors with a same inductance, or may be inductors with different inductances. When it is ensured that the first cross-coupled transistor is not affected by flicker noise, the at least two inductors connected in parallel are disposed, and an inductor with a relatively large inductance is used, thereby achieving a technical effect of reducing a total inductance of the first tail inductor, and avoiding a technical disadvantage that a design is difficult.

In a possible design of the first aspect, the oscillator further includes a second cross-coupled transistor and a second tail inductor. The second tail inductor includes at least two second inductors connected in parallel. The second tail inductor is coupled to a source of the second cross-coupled transistor. The second cross-coupled transistor includes at least a third transistor and a fourth transistor. A gate of the third transistor is coupled to a drain of the fourth transistor. A drain of the third transistor is coupled to a gate of the fourth transistor. The gate of the third transistor and the drain of the fourth transistor in the second cross-coupled transistor are coupled to a first node. The drain of the third transistor and the gate of the fourth transistor in the second cross-coupled transistor are coupled to a second node.

In this application, in the first tail inductor connected to the first cross-coupled transistor, the at least two first inductors connected in parallel are disposed, and an inductor with a relatively large inductance is used, thereby achieving a technical effect of reducing a total inductance of the first tail inductor; in the second tail inductor connected to the second cross-coupled transistor, the at least two second inductors connected in parallel are disposed, and an inductor with a relatively large inductance is used, thereby achieving a technical effect of reducing a total inductance of the second tail inductor, and avoiding a technical disadvantage that a design is difficult. The first cross-coupled transistor and the second cross-coupled transistor may also be collectively referred to as a complementary metal-oxide-semiconductor (CMOS) field effect transistor. The oscillator in which the CMOS is used has the following characteristics: 1. Static power consumption is low. 2. A logic swing is large, and is approximately equal to a power voltage. 3. An anti-interference capability is strong. The oscillator can operate within a relatively wide range of power voltages, and can conveniently interface with another circuit.

In a possible design of the first aspect, when the oscillator includes only the first cross-coupled transistor, the first transistor and the second transistor in the first cross-coupled transistor may be PMOS transistors or NMOS transistors; or when the oscillator includes both the first cross-coupled transistor and the second cross-coupled transistor, the first transistor and the second transistor in the first cross-coupled transistor are PMOS transistors, and the third transistor and the fourth transistor in the second cross-coupled transistor are NMOS transistors.

In a possible design of the first aspect, when the oscillator includes only the first cross-coupled transistor, and the first transistor and the second transistor are P-channel meta-oxide-semiconductor field effect transistors, the source of the first cross-coupled transistor is coupled to the power supply through the first tail inductor, two ends of the resonant circuit are separately coupled to the first node and the second node, and a common-mode terminal of the main inductor is coupled to the ground.

In a possible design of the first aspect, when the oscillator includes only the first cross-coupled transistor, and the first transistor and the second transistor are N-channel meta-oxide-semiconductor field effect transistors, the source of the first cross-coupled transistor is coupled to the ground through the first tail inductor, two ends of the resonant circuit are separately coupled to the first node and the second node, and a common-mode terminal of the main inductor is coupled to the power supply.

In a possible design of the first aspect, when the oscillator includes the first cross-coupled transistor and the second cross-coupled transistor, the first transistor and the second transistor are PMOS transistors, and the third transistor and the fourth transistor are NMOS transistors, the source of the first cross-coupled transistor is coupled to the power supply through the first tail inductor, two ends of the resonant circuit are separately coupled to the first node and the second node, and the source of the second cross-coupled transistor is coupled to the ground through the second tail inductor.

In a possible design of the first aspect, the oscillator further includes the resonant circuit. The resonant circuit includes a main capacitor and a main inductor. The main capacitor and the main inductor are connected in parallel. The two ends of the resonant circuit are separately coupled to the first node and the second node. The main capacitor includes at least one variable capacitance diode or at least one switched capacitor array. The main inductor includes at least one inductor. An operating frequency of the resonant circuit is ½ of a resonance frequency between the first tail inductor and a first capacitor. The first capacitor is coupled to the source of the first cross-coupled transistor. The first tail inductor and the first capacitor are connected in parallel. The first tail inductor is mirror-symmetric with respect to the main inductor in an inductor layout of the oscillator. The second tail inductor is mirror-symmetric with respect to the main inductor in the inductor layout of the oscillator.

In this application, in the oscillator, after the tail inductor is connected to the first capacitor in parallel, when a resonance frequency between the inductor and the capacitor in parallel is twice an operating frequency of the oscillator, the group including the capacitor and the inductor has a high impedance characteristic. When the group including the capacitor and the inductor has the high impedance characteristic, the group including the capacitor and the inductor can effectively suppress impact on the resonant circuit that is caused by flicker noise. It should be noted that the first capacitor may be an equivalent parasitic capacitor, or may be any capacitor in the oscillator. This is not limited herein. In addition, at least two inductors connected in parallel are disposed in the first tail inductor, and at least two inductors connected in parallel are disposed in the second tail inductor, thereby implementing mirror symmetry of the tail inductors with respect to the main inductor in the inductor layout of the oscillator.

In a possible design of the first aspect, the oscillator is a voltage controlled oscillator or a digitally controlled oscillator. This improves implementation flexibility of the solution.

According to a second aspect, an embodiment of this application provides a clock circuit. The clock circuit includes the oscillator in the first aspect of the embodiments of this application, and further includes a power circuit and a functional circuit. The oscillator is configured to provide a clock signal for the functional circuit. The power circuit is configured to provide a voltage for the oscillator and the functional circuit. The functional circuit is configured to determine a data sampling point based on the clock signal.

In this application, the oscillator provided in this application may be used in the clock circuit. In the clock circuit, when it is ensured that the functional circuit obtains the clock signal provided by the oscillator, a tail inductor connected to a cross-coupled transistor in the oscillator includes at least two inductors connected in parallel. Therefore, an inductance of the tail inductor is less than an inductance of any one of the inductors. An inductor with a relatively large size may be used to implement a tail inductor with a small size, thereby avoiding a design difficulty of a tail inductor with a smaller inductance.

In this application, in the oscillator, a tail inductor connected to a cross-coupled transistor includes at least two inductors connected in parallel. Therefore, an inductance of the tail inductor is less than an inductance of any one of the inductors. This can address a design difficulty that a tail inductor with a smaller inductance needs to be used as an operating frequency of a VCO increases.

DESCRIPTION OF EMBODIMENTS

Embodiments of this application provide an oscillator. In the oscillator, a tail inductor connected to a cross-coupled transistor includes at least two inductors connected in parallel. Therefore, an inductance of the tail inductor is less than an inductance of any one of the inductors. This can address a design difficulty that a tail inductor with a smaller inductance needs to be used as an operating frequency of a VCO increases.

The following describes the embodiments of this application with reference to accompanying drawings.

Figure 1:
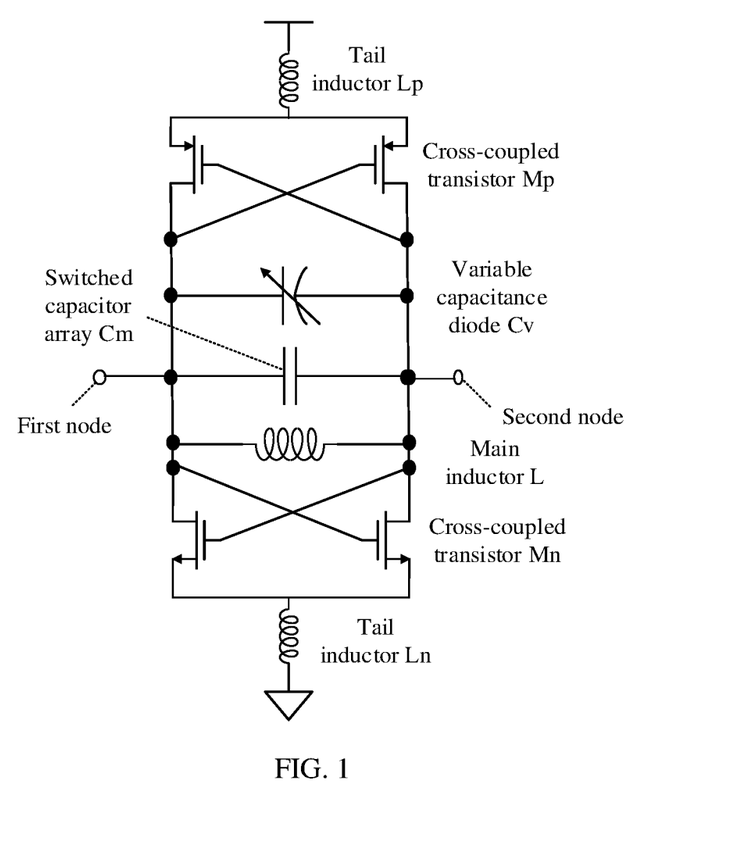
FIG. 1 is a schematic diagram of a circuit connection of an oscillator according to an embodiment of this application.

FIG. 1 is a schematic diagram of a circuit connection of an oscillator according to an embodiment of this application. The oscillator in FIG. 1 is specifically a voltage controlled oscillator (VCO) with a class B structure. In addition to the voltage controlled oscillator, the class B structure may also be used for a digitally controlled oscillator (DCO).

The oscillator in FIG. 1 includes: a cross-coupled transistor Mn and a tail inductor Ln. A source of the cross-coupled transistor Mn is coupled to the tail inductor Ln. The cross-coupled transistor Mn is coupled to a ground of the oscillator through the tail inductor Ln. The cross-coupled transistor Mn includes two transistors. Gates and drains of the two transistors are separately connected to two ends of an inductor-capacitor resonant tank. Sources of the two transistors are coupled to the ground of the oscillator through the tail inductor Ln. The two transistors of a transistor circuit are cross-coupled in that the gate of a first transistor is connected to a drain of the second transistor, and the drain of the first transistor is connected to the gate of the second transistor. The circuit also includes a main inductor L, a switched capacitor array Cm, and a variable capacitance diode Cv. The main inductor L, the switched capacitor array Cm, and the variable capacitance diode Cv are connected in parallel. A circuit structure obtained by connecting the main inductor L, the switched capacitor array Cm, and the variable capacitance diode Cv in parallel is referred to as an inductor (L)-capacitor (C) parallel resonant tank (LC tank). The LC tank may also be referred to as a resonant circuit. Two ends of the resonant circuit may be equivalently considered as a first node and a second node. The first node and the second node are signal output ends of the resonant circuit. The circuit further includes an additional cross-coupled transistor Mp and a tail inductor Lp. A source (source) of the cross-coupled transistor Mp is coupled to the tail inductor Lp. The cross-coupled transistor Mp is coupled to a power supply of the oscillator through the tail inductor Lp. The cross-coupled transistor circuit Mp includes two transistors. Gates and drains of the two transistors are separately connected to the two ends of the inductor-capacitor resonant tank. Sources of the two transistors are coupled to the power supply of the oscillator through the tail inductor Lp. A gate of one transistor is connected to a drain of the other transistor. The other drain is connected to a gate of the other transistor.

In more detail, the cross-coupled transistor is an electronic device obtained by packaging two metal-oxide-semiconductor (MOS) field effect transistors with a same performance parameter, and can form a differential amplifier with excellent performance in the simplest way. "Disadvantages" exist at a junction of a channel and a gate oxide of the MOS transistor, and these "disadvantages" constantly release and capture "carriers". As a result, the cross-coupled transistor generates flicker noise (flicker noise), and the flicker noise enters the LC tank and affects noise performance of the oscillator. To suppress the flicker noise of the cross-coupled transistor, an inductor is usually disposed at a source of a cross-coupled transistor in the cross-coupled transistor, and the inductor is usually referred to as a tail inductor.

In an integrated circuit, due to existence of an interlayer dielectric (ILD), capacitance (i.e., a capacitor) inevitably exists between wires. This capacitor is referred to as a parasitic capacitor. In the oscillator, a circuit part connected to the source of the cross-coupled transistor may be equivalently considered as a parasitic capacitor B. After the tail inductor is connected to the parasitic capacitor B at the source of the cross-coupled transistor, when a resonance frequency between the inductor and the capacitor connected in parallel is twice an operating frequency of the oscillator, the group of impedances including the capacitor and the inductor has a high impedance characteristic. When the group including the capacitor and the inductor has the high impedance characteristic, the group of impedances including the capacitor and the inductor can effectively suppress impact on the LC tank that is caused by flicker noise. A larger impedance value indicates smaller impact on the LC tank that is caused by flicker noise. It should be noted that the tail inductor not only has the high impedance characteristic when the resonance frequency between the tail inductor and the parasitic capacitor B is twice the operating frequency of the oscillator, but also can form a resonant circuit with any other capacitor in the oscillator. When an oscillation frequency of the resonant circuit is twice the operating frequency of the oscillator, the group of impedances including the capacitor and the inductor also has a high impedance characteristic. Alternatively, the tail inductor (which inherently has some capacitance of its own) may form a resonant circuit without any additional capacitor. In this case, the tail inductor may still have a high impedance characteristic.

Specifically, a circuit obtained by connecting the capacitor and the inductor in parallel is referred to as an LC parallel circuit. In an ideal state, an impedance formula for the group including the capacitor and the inductor connected in parallel is as follows:

$$Total\, impedance = \frac{1}{\frac{1}{Ls}+Cs} = \frac{Ls}{LCs^2+1} = \frac{1-LC\omega^2}{C\omega j}, \text{ where}$$

$$\text{when } \omega = \frac{1}{\sqrt{LC}},$$

$$Total\, impedance = \frac{1}{\frac{1}{Ls}+Cs} = \infty,$$

that is, the total impedance is infinite.

L is a tail inductance, C is a resonance capacitance, and ω is the resonance frequency. Based on the foregoing descriptions, when the resonance frequency ω is higher, a corresponding inductance L needs to be smaller. In an actual application scenario, the oscillator is usually used in a high frequency circuit, and the operating frequency of the oscillator is quite high. When the resonance frequency is twice the operating frequency of the oscillator, the group including the capacitor and the inductor has the high impedance characteristic. Therefore, the resonance frequency is higher. Therefore, the inductance of the tail inductor needs to be quite small to achieve the high impedance characteristic of the group including the capacitor and the inductor.

However, the tail inductor with a quite small inductance causes the following two types of impact: First, it is difficult to select a device. Second, a relatively large error is likely to occur during design of an inductor layout. The second point is described below. Because no wire or component in an actual circuit can be considered to have an inductance of 0, equivalent inductances of all wires and/or components need to be represented in the inductor layout. In the inductor layout, a length of a line is positively correlated with an inductance. When the inductance of the tail inductor is quite small, a length of a line for the tail inductor in the inductor layout is quite short. Therefore, an error range allowed during the design of the inductor layout is quite small. This can cause design problems.

Figure 2:
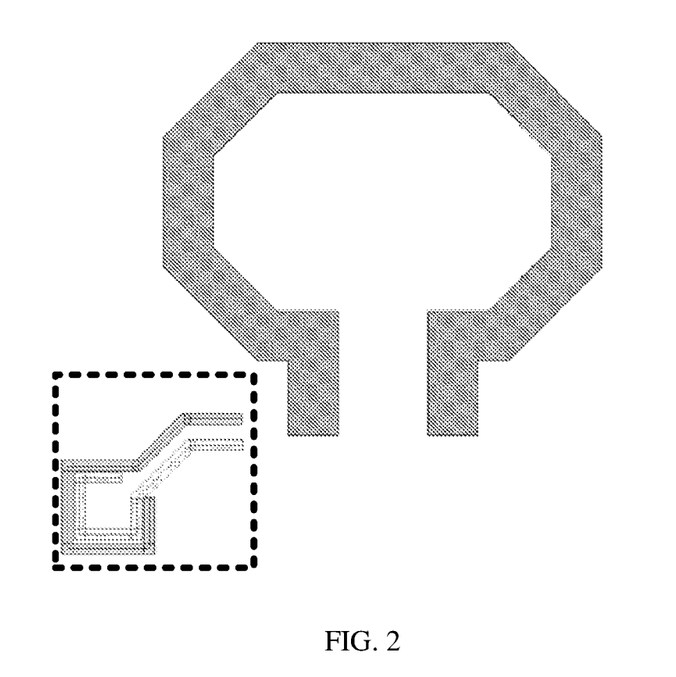
FIG. 2 is a schematic diagram of an inductor layout of an oscillator according to an embodiment of this application.

In addition, the tail inductor is introduced as a component in the oscillator in FIG. 1. The tail inductor causes asymmetry of the oscillator, and the asymmetry results in noise and affects performance of the oscillator. For ease of understanding, refer to FIG. 2. FIG. 2 is a schematic diagram of an inductor layout of an oscillator according to an embodiment of this application. A typical inductor layout of the oscillator in FIG. 1 is shown in FIG. 2. Lines in a dashed-line box indicate the tail inductor. It can be visually learned that asymmetry of the oscillator arises in the inductor layout when the tail inductor in the oscillator includes only one inductor.

Based on the foregoing disadvantage, this application provides an oscillator. In the oscillator, a tail inductor connected to a cross-coupled transistor includes at least two inductors connected in parallel. Therefore, a total inductance of the tail inductor is less than an inductance of any one of the inductors that comprise the tail inductor. This can address a design difficulty that a tail inductor with a smaller inductance needs to be used as an operating frequency of a VCO increases. Still further, asymmetry of the oscillator that arises after the tail inductor is introduced can be addressed.

Figure 3A:
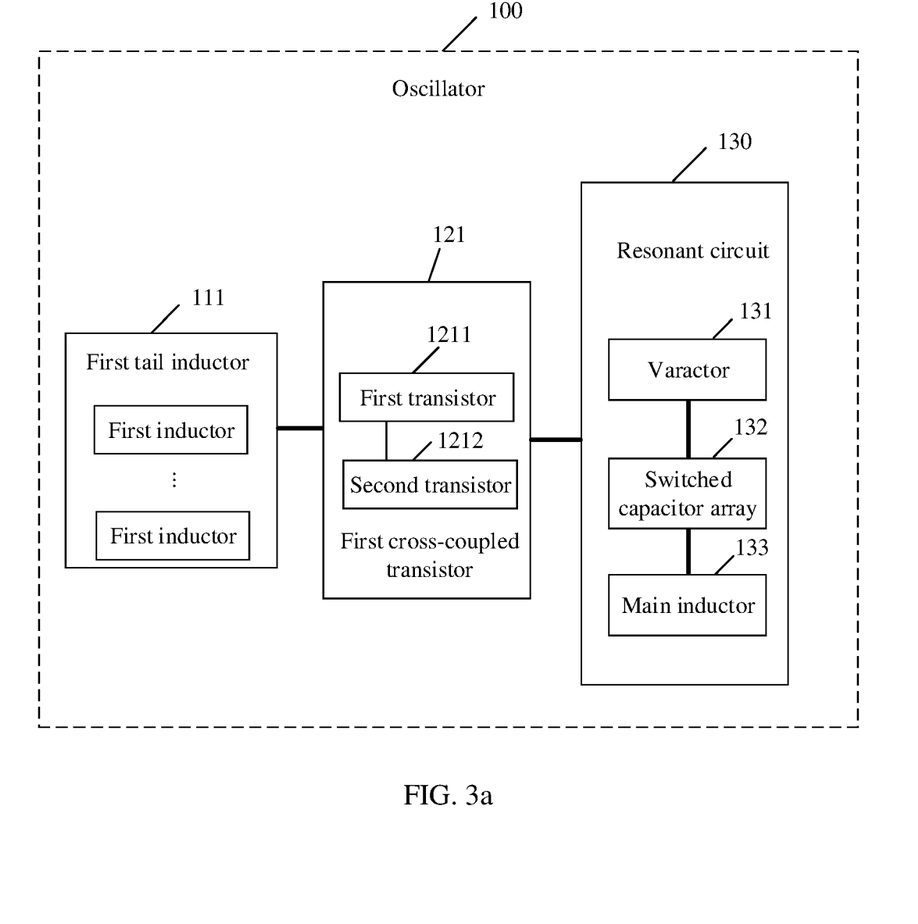
FIG. 3a is a schematic structural diagram of an oscillator according to an embodiment of this application.

The following describes the oscillator provided in the embodiments of this application. FIG. 3a is a schematic structural diagram of an oscillator according to an embodiment of this application.

As shown in FIG. 3a, an embodiment of this application provides an oscillator 100. The oscillator 100 includes a first tail inductor 111, a first cross-coupled transistor 121, and a resonant circuit 130. The first tail inductor 111 includes at least two first inductors connected in parallel. The first cross-coupled transistor 121 includes a first transistor 1211 and a second transistor 1212. The first inductors may be inductors with a same inductance, or may be inductors with different inductances. This is not limited herein.

The first cross-coupled transistor 121 includes the first transistor 1211 and the second transistor 1212. A source of the first transistor 1211 and a source of the second transistor 1212 may be equivalently considered as a source of the first cross-coupled transistor 121. The source of the first cross-coupled transistor 121 is coupled to the first tail inductor 111. The source of the first cross-coupled transistor 121 is coupled to a power supply of the oscillator 100 or a ground of the oscillator 100 through the first tail inductor 111. An oscillation frequency between the first tail inductor 111 and a first capacitor connected to the first cross-coupled transistor 121 is twice an operating frequency of the oscillator 100. It should be noted that, that the oscillation frequency is twice the operating frequency of the oscillator 100 is merely an example for description, and a specific multiple is not limited. For example, the oscillation frequency between the first tail inductor 111 and the first capacitor connected to the first cross-coupled transistor 121 may be 1.5 times the operating frequency of the oscillator 100. The first capacitor may be a parasitic capacitor in the oscillator, or may be another capacitor. This is not limited herein.

The resonant circuit 130 includes a varactor 131, a switched capacitor array 132, and a main inductor 133. The three components are connected in parallel.

A gate of the first transistor 1211 in the first cross-coupled transistor 121 is coupled to a drain of the second transistor 1212, and is coupled to one end of the resonant circuit 130, where the connection point may be equivalently considered as a first node. A drain of the first transistor 1211 in the first cross-coupled transistor 121 is coupled to a gate of the second transistor 1212, and is coupled to one end of the resonant circuit 130, where the connection point may be equivalently considered as a second node.

When the source of the first cross-coupled transistor 121 is coupled to the power supply of the oscillator 100 through the first tail inductor 111, the first cross-coupled transistor 121 may be a P-channel meta-oxide-semiconductor (PMOS) field effect transistor.

Figure 3B:
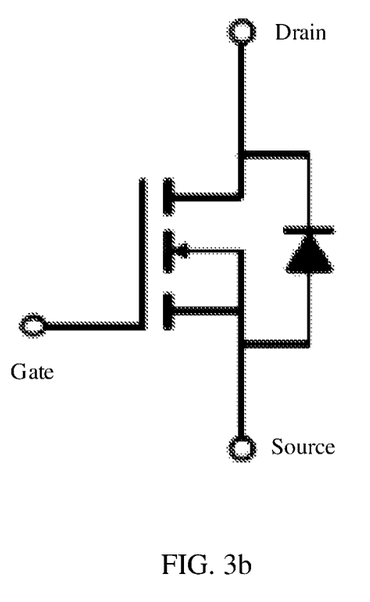
FIG. 3b is a schematic structural diagram of a PMOS FET according to an embodiment of this application.

With respect to the PMOS, metal-oxide-semiconductor (MOS) field effect transistors may be classified into two types: N-channel and P-channel A P-channel silicon MOS field effect transistor has two P+ regions on an N-type silicon substrate that are referred to as a source and a drain. The source and the drain are not conducted. When a sufficient negative voltage is applied to a gate (the source is grounded), a surface of N-type silicon under the gate presents a P-type inversion layer that becomes a channel for connecting the source and the drain. Changing the gate voltage can change electron density in the channel, to change a resistance of the channel. This MOS field effect transistor is referred to as a P-channel enhancement mode field effect transistor. If a P-type inversion layer channel exists on a surface of the N-type silicon substrate without applying a gate voltage, a resistance of the channel may be increased or decreased by applying an appropriate bias voltage. This MOS field effect transistor is referred to as a P-channel depletion mode field effect transistor. The P-channel enhancement mode field effect transistor and the P-channel depletion mode field effect transistor are collectively referred to as a PMOS transistor. For ease of understanding, refer to FIG. 3b. FIG. 3b is a schematic structural diagram of a PMOS according to an embodiment of this application.

When the source of the first cross-coupled transistor 121 is coupled to the ground of the oscillator 100 through the first tail inductor 111, the first cross-coupled transistor 121 may be an N-channel meta-oxide-semiconductor (negative channel-metal-oxide-semiconductor, NMOS) field effect transistor.

Figure 3C:
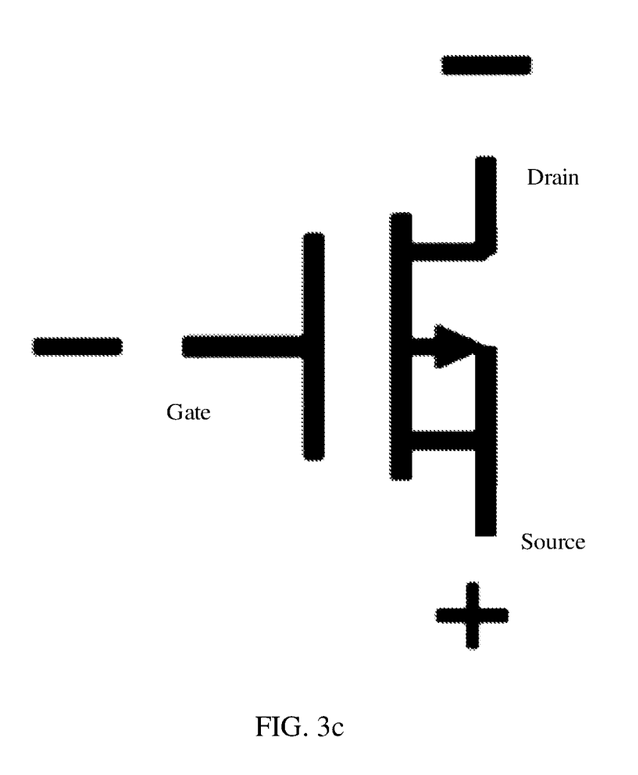
FIG. 3c is a schematic structural diagram of an NMOS FET according to an embodiment of this application.

With respect to the NMOS, a MOS transistor including a P-type substrate and two high-concentration N diffusion regions is referred to as an N-channel MOS transistor. When the transistor is conducted, an N-type conductive channel is formed between the two high-concentration N diffusion regions. An N-channel enhancement mode MOS transistor is an N-channel MOS transistor in which a forward bias voltage needs to be applied to a gate and a conductive channel is generated only when a gate-source voltage is greater than a threshold voltage. An N-channel depletion mode MOS transistor is an N-channel MOS transistor in which a conductive channel is generated without applying a gate voltage (a gate-source voltage is zero). The N-channel enhancement mode field effect transistor and the N-channel depletion mode field effect transistor are collectively referred to as an NMOS transistor. For ease of understanding, refer to FIG. 3c. FIG. 3c is a schematic structural diagram of an NMOS according to an embodiment of this application.

In this embodiment of this application, in the first tail inductor 111 connected to the first cross-coupled transistor 121, at least two inductors connected in parallel are disposed, and an inductor with a relatively large inductance is used, thereby achieving a technical effect of reducing a total inductance of the first tail inductor 111, and avoiding a technical disadvantage that a design is difficult. In addition, at least two inductors connected in parallel are disposed in the first tail inductor 111, thereby implementing mirror symmetry of the inductor layout with respect to the main inductor in the inductor layout of the oscillator 100.

When the source of the first cross-coupled transistor 121 is coupled to the power supply of the oscillator 100 through the first tail inductor 111, the first cross-coupled transistor 121 may be a PMOS transistor. The oscillator 100 may further include a second cross-coupled transistor and a second tail inductor. Specifically, FIG. 3d is another schematic structural diagram of an oscillator according to an embodiment of this application.

Figure 3D:
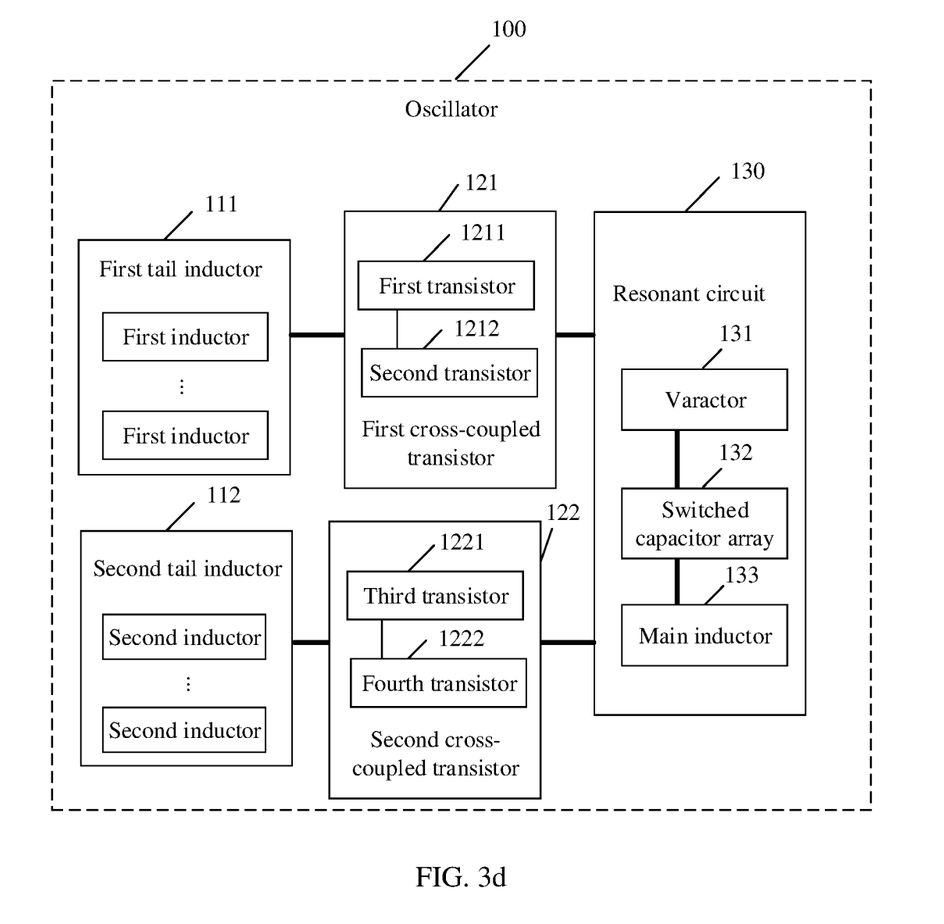
FIG. 3d is another schematic structural diagram of an oscillator according to an embodiment of this application.

As shown in FIG. 3d, an embodiment of this application provides an oscillator 100. The oscillator 100 includes a first tail inductor 111, a first cross-coupled transistor 121, a resonant circuit 130, a second tail inductor 112, and a second cross-coupled transistor 122. The first tail inductor 111 includes at least two first inductors connected in parallel. The second tail inductor 112 includes at least two second inductors connected in parallel. The first cross-coupled transistor 121 includes a first transistor 1211 and a second transistor 1212. The second cross-coupled transistor 122 includes a third transistor 1221 and a fourth transistor 1222. The first inductors may be inductors with a same inductance, or may be inductors with different inductances. This is not limited herein. The second inductors may be inductors with a same inductance, or may be inductors with different inductances. This is not limited herein.

The first cross-coupled transistor 121 includes the first transistor 1211 and the second transistor 1212. A source of the first transistor 1211 and a source of the second transistor 1212 may be equivalently considered as a source of the first cross-coupled transistor 121. The source of the first cross-coupled transistor 121 is coupled to the first tail inductor 111. The source of the first cross-coupled transistor 121 is coupled to a power supply of the oscillator 100 through the first tail inductor 111. The first cross-coupled transistor 121 is a PMOS transistor.

The second cross-coupled transistor 122 includes the third transistor 1221 and the fourth transistor 1222. A source of the third transistor 1221 and a source of the fourth transistor 1222 may be equivalently considered as a source of the second cross-coupled transistor 122. The source of the second cross-coupled transistor 122 is coupled to the second tail inductor 112. The source of the second cross-coupled transistor 122 is coupled to a ground of the oscillator 100 through the second tail inductor 112. The second cross-coupled transistor 122 is an NMOS transistor.

A gate of the first transistor 1211 in the first cross-coupled transistor 121 is coupled to a drain of the second transistor 1212, and is coupled to one end of the resonant circuit 130, where the connection point may be equivalently considered as a first node. A drain of the first transistor 1211 in the first cross-coupled transistor 121 is coupled to a gate of the second transistor 1212, and is coupled to the other end of the resonant circuit 130, where the connection point may be equivalently considered as a second node.

A gate of the third transistor 1221 in the second cross-coupled transistor 122 is coupled to a drain of the fourth transistor 1222, and is coupled to one end of the resonant circuit 130, where the connection point may be equivalently considered as the first node. A drain of the third transistor 1221 in the second cross-coupled transistor 122 is coupled to a gate of the fourth transistor 1222, and is coupled to the other end of the resonant circuit 130, where the connection point may be equivalently considered as the second node.

The resonant circuit 130 includes a varactor 131, a switched capacitor array 132, and a main inductor 133. The three components are connected in parallel. The second cross-coupled transistor 122 is an NMOS transistor.

The first cross-coupled transistor 121 and the second cross-coupled transistor 122 may also be collectively referred to as a complementary meta-oxide-semiconductor (complementary metal-oxide-semiconductor, CMOS) field effect transistor.

Figure 4:
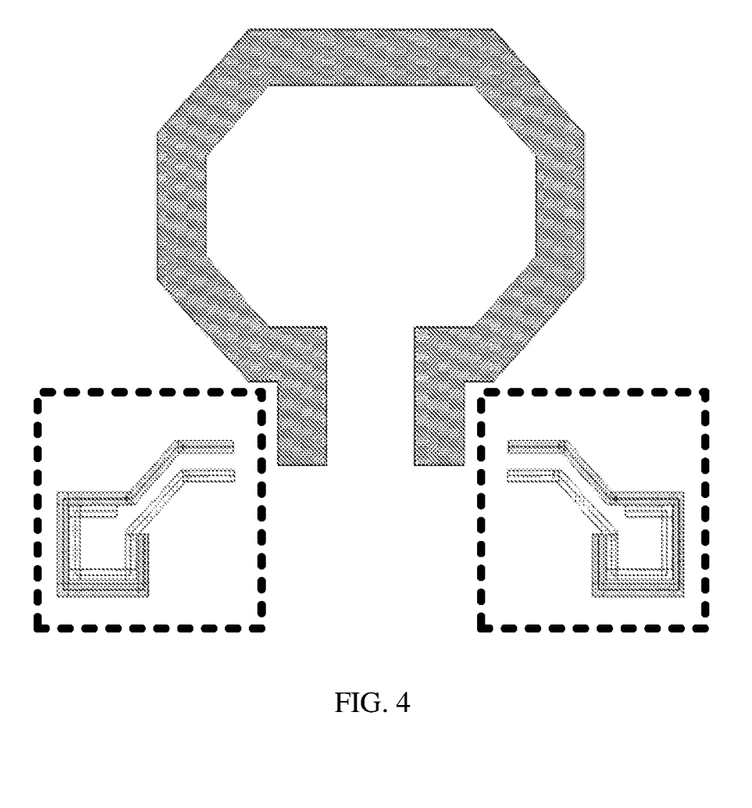
FIG. 4 is a schematic diagram of an inductor layout of another oscillator according to an embodiment of this application.

When the tail inductors in the oscillator 100, namely, the first tail inductor 111 and the second tail inductor 112, each are obtained by connecting at least two inductors in parallel, mirror symmetry with respect to the main inductor may be implemented in the inductor layout of the oscillator 100. For ease of understanding, refer to FIG. 4. FIG. 4 is a schematic diagram of an inductor layout of another oscillator according to an embodiment of this application. A typical inductor layout of the oscillator 100 in FIG. 3d is shown in FIG. 4. Lines in a dashed-line box indicate the tail inductor. It can be visually learned that the oscillator is mirror symmetric with respect to the main inductor in the inductor layout when the tail inductor in the oscillator includes at least two inductors connected in parallel.

It should be noted that the oscillator 100 is illustrated only by using a single-core (single core) structure. In the single-core structure, one oscillator includes only one resonant circuit 130. Alternatively, the oscillator 100 may be in a dual-core structure or a multi-core structure. In the dual-core structure, one oscillator includes two resonant circuits 130, and each resonant circuit 130 is connected to one or two cross-coupled transistors. In the multi-core structure, one oscillator includes a plurality of resonant circuits 130, and each resonant circuit 130 is connected to one or two cross-coupled transistors. This is not limited herein.

In this embodiment of this application, in the first tail inductor 111 connected to the first cross-coupled transistor 121, at least two inductors connected in parallel are disposed, and an inductor with a relatively large inductance is used, thereby achieving a technical effect of reducing a total inductance of the first tail inductor 111; in the second tail inductor 112 connected to the second cross-coupled transistor 122, at least two inductors connected in parallel are disposed, and an inductor with a relatively large inductance is used, thereby achieving a technical effect of reducing a total inductance of the first tail inductor 111 and the second tail inductor 112, and avoiding a technical disadvantage that a design is difficult. In addition, at least two inductors connected in parallel are disposed in the first tail inductor 111, and at least two inductors connected in parallel are disposed in the second tail inductor 112, thereby implementing mirror symmetry of the inductor layout with respect to the main inductor in the inductor layout of the oscillator 100. The oscillator 100 in which the COMS transistor is used has the following characteristics: 1. Static power consumption is low. 2. A logic swing is large, and is approximately equal to a power voltage. 3. An anti-interference capability is strong.

The oscillator 100 can operate within a relatively wide range of power voltages, and can conveniently interface with another circuit.

For ease of understanding, the following further describes the embodiments of this application with reference to the accompanying drawings.

Figure 5:
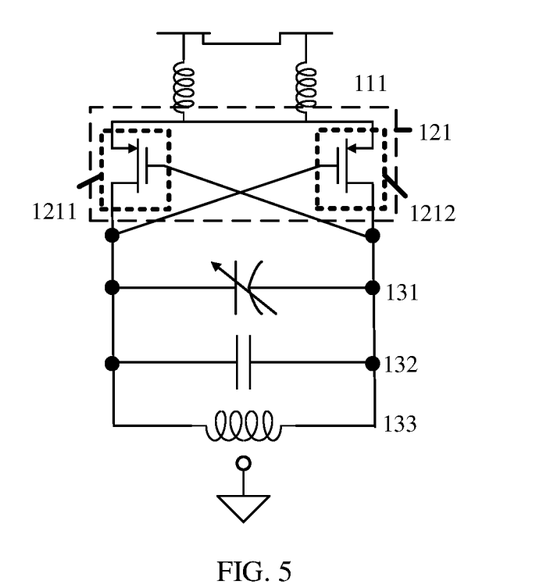
FIG. 5 is a schematic diagram of another circuit connection of an oscillator according to an embodiment of this application.

FIG. 5 is a schematic diagram of another circuit connection of an oscillator according to an embodiment of this application. As shown in the figure, the oscillator 100 includes a first tail inductor 111, a first cross-coupled transistor 121, a varactor 131, a switched capacitor array 132, and a main inductor 133. The first cross-coupled transistor 121 includes a first transistor 1211 and a second transistor 1212. A source of the first cross-coupled transistor 121 is coupled to a power supply of the oscillator 100 through the first tail inductor 111. A resonant circuit 130 including the varactor 131, the switched capacitor array 132, and the main inductor 133 is coupled to a ground of the oscillator 100. The first cross-coupled transistor 121 is a PMOS transistor. The first tail inductor 111 includes at least two inductors connected in parallel. A gate of the first transistor 1211 in the first cross-coupled transistor 121 is coupled to a drain of the second transistor 1212, and is coupled to one end of the resonant circuit 130, where the connection point may be equivalently considered as a first node. A drain of the first transistor 1211 in the first cross-coupled transistor 121 is coupled to a gate of the second transistor 1212, and is coupled to the other end of the resonant circuit 130, where the connection point may be equivalently considered as a second node. The first cross-coupled transistor 121, the varactor 131, the switched capacitor array 132, and the main inductor 133 are connected in parallel.

Figure 6:
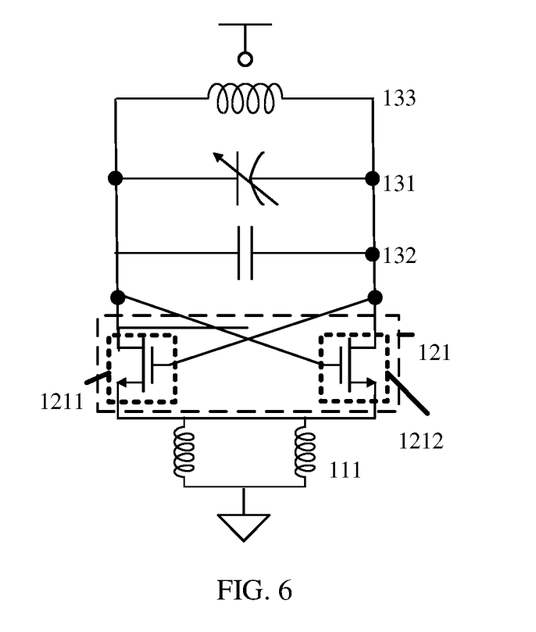
FIG. 6 is a schematic diagram of another circuit connection of an oscillator according to an embodiment of this application.

FIG. 6 is a schematic diagram of another circuit connection of an oscillator according to an embodiment of this application. As shown in the figure, the oscillator 100 includes a first tail inductor 111, a first cross-coupled transistor 121, a varactor 131, a switched capacitor array 132, and a main inductor 133. The first cross-coupled transistor 121 includes a first transistor 1211 and a second transistor 1212. A source of the first cross-coupled transistor 121 is coupled to a ground of the oscillator 100 through the first tail inductor 111. A resonant circuit 130 including the varactor 131, the switched capacitor array 132, and the main inductor 133 is coupled to a power supply of the oscillator 100. The first cross-coupled transistor 121 is an NMOS transistor. The first tail inductor 111 includes two inductors connected in parallel. A gate of the first transistor 1211 in the first cross-coupled transistor 121 is coupled to a drain of the second transistor 1212, and is coupled to one end of the resonant circuit 130, where the connection point may be equivalently considered as a first node. A drain of the first transistor 1211 in the first cross-coupled transistor 121 is coupled to a gate of the second transistor 1212, and is coupled to the other end of the resonant circuit 130, where the connection point may be equivalently considered as a second node. The first cross-coupled transistor 121, the varactor 131, the switched capacitor array 132, and the main inductor 133 are connected in parallel. The first tail inductor 111, the first cross-coupled transistor 121, the varactor 131, the switched capacitor array 132, and the main inductor 133 are connected in parallel.

Figure 7:
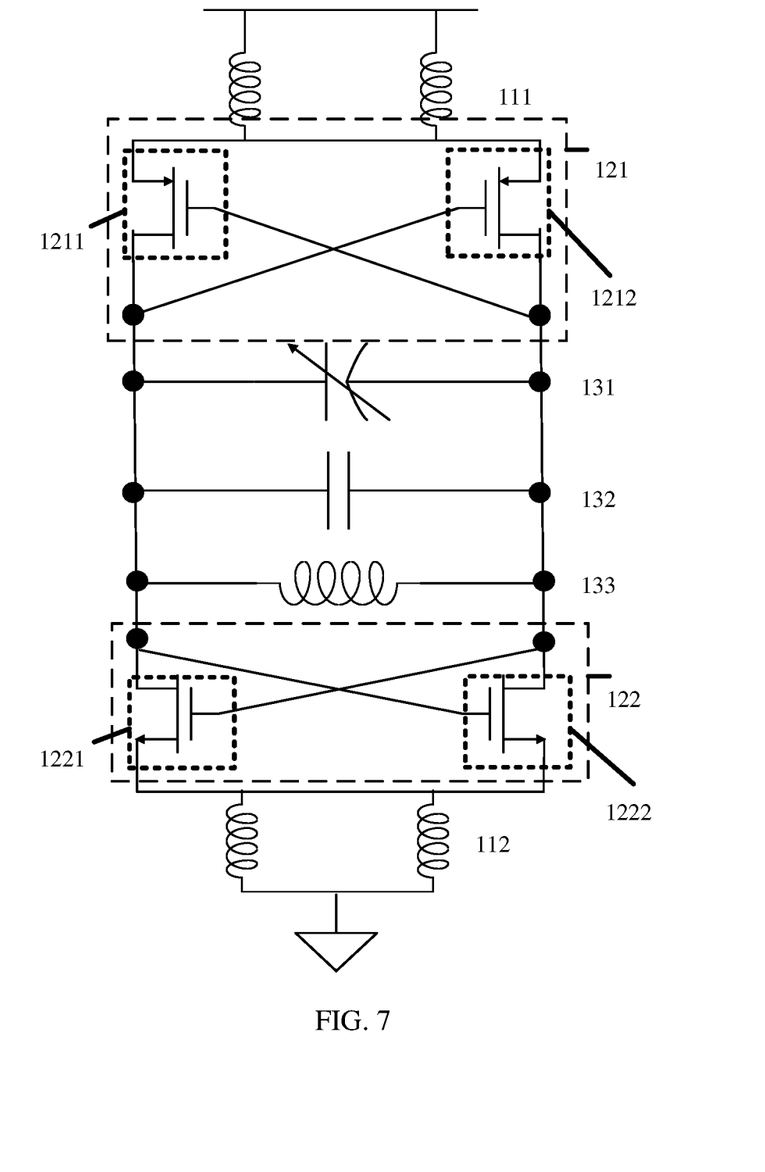
FIG. 7 is a schematic diagram of another circuit connection of an oscillator according to an embodiment of this application.

FIG. 7 is a schematic diagram of another circuit connection of an oscillator according to an embodiment of this application. As shown in the figure, the oscillator 100 includes a first tail inductor 111, a first cross-coupled transistor 121, a resonant circuit 130, a second tail inductor 112, and a second cross-coupled transistor 122. The first tail inductor 111 includes at least two inductors connected in parallel. The second tail inductor 112 includes at least two inductors connected in parallel. The first cross-coupled transistor 121 includes a first transistor 1211 and a second transistor 1212. The second cross-coupled transistor 122 includes a third transistor 1221 and a fourth transistor 1222. The inductors may be inductors with a same inductance, or may be inductors with different inductances. This is not limited herein.

The first cross-coupled transistor 121 includes the first transistor 1211 and the second transistor 1212. A source of the first transistor 1211 and a source of the second transistor 1212 may be equivalently considered as a source of the first cross-coupled transistor 121. The source of the first cross-coupled transistor 121 is coupled to the first tail inductor 111. The source of the first cross-coupled transistor 121 is coupled to a power supply of the oscillator 100 through the first tail inductor 111. The first cross-coupled transistor 121 is a PMOS transistor.

The second cross-coupled transistor 122 includes the third transistor 1221 and the fourth transistor 1222. A source of the third transistor 1221 and a source of the fourth transistor 1222 may be equivalently considered as a source of the second cross-coupled transistor 122. The source of the second cross-coupled transistor 122 is coupled to the second tail inductor 112. The source of the second cross-coupled transistor 122 is coupled to a ground of the oscillator 100 through the second tail inductor 112. The second cross-coupled transistor 122 is an NMOS transistor.

A gate of the first transistor 1211 in the first cross-coupled transistor 121 is coupled to a drain of the second transistor 1212, and is coupled to one end of the resonant circuit 130, where the connection point may be equivalently considered as a first node. A drain of the first transistor 1211 in the first cross-coupled transistor 121 is coupled to a gate of the second transistor 1212, and is coupled to the other end of the resonant circuit 130, where the connection point may be equivalently considered as a second node.

A gate of the third transistor 1221 in the second cross-coupled transistor 122 is coupled to a drain of the fourth transistor 1222, and is coupled to one end of the resonant circuit 130, where the connection point may be equivalently considered as the first node. A drain of the third transistor 1221 in the second cross-coupled transistor 122 is coupled to a gate of the fourth transistor 1222, and is coupled to the other end of the resonant circuit 130, where the connection point may be equivalently considered as the second node. The resonant circuit 130 includes a varactor 131, a switched capacitor array 132, and a main inductor 133. The three components are connected in parallel. The second cross-coupled transistor 122 is an NMOS transistor.

Figure 8:
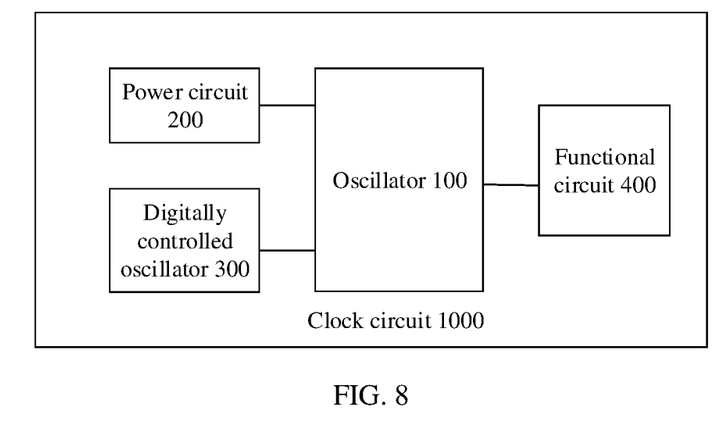
FIG. 8 is a schematic structural diagram of a clock circuit according to an embodiment of this application.

This application further provides a clock circuit. The clock circuit includes the oscillator in the embodiments of this application. For ease of understanding, refer to FIG. 8. FIG. 8 is a schematic structural diagram of a clock circuit according to an embodiment of this application. When the clock circuit 1000 includes the oscillator 100, the oscillator 100 is configured to provide an oscillating signal.

When the clock circuit 1000 includes the oscillator 100, the clock circuit further includes a power circuit 200. The power circuit 200 is configured to provide a voltage for the oscillator 100, and a power supply of the oscillator 100 is coupled to the power circuit 200.

When the oscillator 100 is a VCO, the clock circuit further includes a digitally controlled oscillator 300. The digitally controlled oscillator 300 is configured to provide a control word for the oscillator 100, and the power supply of the oscillator 100 is coupled to the digitally controlled oscillator 300.

The clock circuit further includes a functional circuit 400. The functional circuit 400 is configured to receive the oscillating signal provided by the oscillator 100. A ground of the oscillator 100 is coupled to the functional circuit 400. The functional circuit 400 determines a clock signal based on the oscillating signal provided by the oscillator 100. The clock signal provides timing for each part of a digital circuit, so that each process can be triggered at a precise point in time. For example, a data sampling point is determined based on a clock signal "0101". A time at which a clock signal "0" changes to a clock signal "1" is a data sampling moment, and a time at which a clock signal "1" changes to a clock signal "0" is not a data sampling moment. The functional circuit 400 or another part of the digital circuit samples data at a specified moment based on the clock signal "0101". It should be noted that the foregoing method for determining a data sampling point is merely used as an example for description, and in actual application, another method may be alternatively used. This is not limited herein.

It should be noted that the clock circuit 1000 may be used in a Bluetooth chip for transmitting and receiving Bluetooth signals; or may be used in a Wi-Fi chip for transmitting and receiving wireless fidelity (wireless fidelity, Wi-Fi) signals, or the like; or may be used in a circuit such as a phase locked loop (phase locked loop, PLL) or a clock data recovery (clock data recovery, CDR) circuit. This is not limited herein.

An embodiment of this application further provides a clock circuit. The oscillator provided in the foregoing embodiments is used in the clock circuit. A functional circuit in the clock circuit determines a clock signal based on an oscillating signal provided by the oscillator. This improves implementation flexibility of the solution.

It should be understood that "one embodiment" or "an embodiment" mentioned in the entire specification means that particular features, structures, or characteristics related to the embodiment are included in at least one embodiment of this application. Therefore, "in one embodiment" or "in an embodiment" appearing throughout the specification does not mean a same embodiment. In addition, these particular features, structures, or characteristics may be combined in one or more embodiments by using any appropriate manner. It should be understood that sequence numbers of the foregoing processes do not mean execution sequences in various embodiments of this application. The execution sequences of the processes should be determined based on functions and internal logic of the processes, and should not be construed as any limitation on the implementation processes of the embodiments of this application.

In addition, the terms "system" and "network" may be used interchangeably in this specification. The term "and/or" in this specification describes only an association relationship for associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of this application, "B corresponding to A" indicates that B is associated with A, and B may be determined based on A. However, it should be further understood that determining A based on B does not mean that B is determined based on A only; in other words, B may also be determined based on A and/or other information.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example based on functions. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for detailed working processes of the foregoing system, apparatus, and unit, refer to corresponding processes in the foregoing method embodiments, and details are not described herein again.

In the several embodiments provided in this application, it should be understood that the disclosed system, apparatus, and method may be implemented in other manners. For example, the described apparatus embodiment is merely an example. For example, division into modules is merely logical function division and may be other division in an actual implementation. For example, a plurality of modules or components may be combined or integrated into another system, or some features may be ignored or not performed. In addition, the displayed or discussed mutual couplings or direct couplings or communication connections may be implemented through some interfaces, indirect couplings or communication connections between the apparatuses or modules, or electrical connections, mechanical connections, or connections in other forms.

The modules described as separate parts may or may not be physically separate, and parts displayed as modules may or may not be physical modules, may be located in one position, or may be distributed on a plurality of network modules. Some or all the modules may be selected based on actual needs to achieve the objectives of the solutions of the embodiments in this application.

In addition, functional modules in this application may be integrated into one processing module, or each of the modules may exist alone physically, or two or more modules may be integrated into one module. The integrated module may be implemented in a form of hardware, or may be implemented in a form of a software functional module.

In summary, what is described above is merely example embodiments of the technical solutions of this application, but is not intended to limit the protection scope of this application. Any modification, equivalent replacement, or improvement made without departing from the principle of this application shall fall within the protection scope of this application.

The oscillator 100, the clock circuit 1000, and the components that are provided in this application are described in detail above. In this specification, specific implementations of this application are described herein through specific examples. The description about the embodiments is merely provided to help understand the method and core ideas of this application. In addition, a person of ordinary skill in the art can make variations and modifications to this application in terms of the specific implementations and application scopes according to this application. Therefore, the content of this specification shall not be construed as a limit to this application.

What is claimed is:

1. An oscillator comprising:
a resonant circuit having first and second ends;
a first tail inductance comprising at least two first inductors connected in parallel to a power supply or a ground;
a first transistor and a second transistor that are cross-coupled, wherein sources of the first transistor and the second transistor are connected together and are connected to the power supply or the ground through the first tail inductance,
a gate of the first transistor, a drain of the second transistor, and the first end of the resonant circuit are coupled to a first node,
a drain of the first transistor, a gate of the second transistor, and the second end of the resonant circuit are coupled to a second node;
a second tail inductance comprising at least two second inductors connected in parallel;
a third transistor and a fourth transistor that are cross-coupled, and sources of the third transistor and the fourth transistor being coupled to the ground through the second tail inductance; and
a gate of the third transistor and a drain of the fourth transistor are coupled to the first node, and a drain of the third transistor and a gate of the fourth transistor are coupled to the second node.

2. The oscillator according to claim 1, wherein the first transistor and the second transistor are P-channel metal-oxide-semiconductor (PMOS) field effect transistors, or the first transistor and the second transistor are N-channel metal-oxide-semiconductor (NMOS) field effect transistors.

3. The oscillator according to claim 1, wherein when the first transistor and the second transistor are P-channel metal-oxide-semiconductor (PMOS) field effect transistors, the third transistor and the fourth transistor are N-channel metal-oxide-semiconductor (NMOS) field effect transistors.

4. The oscillator according to claim 3, wherein the resonant circuit comprises a main capacitor and a main inductor, and the main capacitor and the main inductor are connected in parallel.

5. The oscillator according to claim 4, wherein the main capacitor comprises at least one variable capacitance diode or at least one switched capacitor array.

6. The oscillator according to claim 5, wherein the main inductor comprises at least one inductor.

7. The oscillator according to claim 6, wherein an operating frequency of the resonant circuit is ½ of a resonance frequency between the first tail inductance and a first capacitor, the first capacitor being coupled to the source of the first cross-coupled transistor, and the first tail inductance and the first capacitor being connected in parallel.

8. The oscillator according to claim 1, wherein the first transistor and the second transistor are P-channel metal-oxide-semiconductor field effect transistors, and
the source of the first cross-coupled transistor is coupled to the power supply through the first tail inductance, two ends of the resonant circuit are separately coupled to the first node and the second node, and the resonant circuit comprises a main inductor having a common-mode terminal coupled to the ground.

9. The oscillator according to claim 1, wherein the first transistor and the second transistor are N-channel metal-oxide-semiconductor (NMOS) field effect transistors, and
the source of the first cross-coupled transistor is coupled to the ground through the first tail inductance, two ends of the resonant circuit are separately coupled to the first node and the second node, and the resonant circuit comprises a main inductor having a common-mode terminal coupled to the power supply.

10. The oscillator according to claim 7, wherein the oscillator further comprises the second cross-coupled transistor, and
the source of the first cross-coupled transistor is coupled to the power supply through the first tail inductance, two ends of the resonant circuit are separately coupled to the first node and the second node, and a source of the second cross-coupled transistor is coupled to the ground through the second tail inductance.

11. The oscillator according to claim 10, wherein the first tail inductance is mirror-symmetric with respect to the main inductance in an inductor layout of the oscillator.

12. The oscillator according to claim 11, wherein the second tail inductance is mirror-symmetric with respect to the main inductor in the inductor layout of the oscillator.

13. The oscillator according to claim 1, wherein the oscillator is a voltage controlled oscillator or a digitally controlled oscillator.

14. A clock circuit comprising:
an oscillator,
a power circuit, and
a functional circuit;
the oscillator comprises the oscillator according to claim 1, and the oscillator is configured to provide an oscillating signal for the functional circuit;
the power circuit is configured to provide a voltage for the oscillator and the functional circuit; and
the functional circuit is configured to determine a clock signal based on the oscillating signal.

* * * * *